United States Patent

Hayashi et al.

(10) Patent No.: US 8,029,950 B2
(45) Date of Patent: Oct. 4, 2011

(54) REFLECTIVE MASK BLANK FOR EUV LITHOGRAPHY

(75) Inventors: Kazuyuki Hayashi, Tokyo (JP); Toshiyuki Uno, Tokyo (JP); Ken Ebihara, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/855,053

(22) Filed: Aug. 12, 2010

(65) Prior Publication Data

US 2010/0304283 A1  Dec. 2, 2010

Related U.S. Application Data

(63) Continuation of application No. PCT/JP2009/052938, filed on Feb. 19, 2009.

(30) Foreign Application Priority Data

Mar. 18, 2008  (JP) ................................. 2008-069215

(51) Int. Cl.
G03F 1/00 (2006.01)
(52) U.S. Cl. .......................................................... 430/5
(58) Field of Classification Search .............. 430/5, 394; 428/428, 430; 378/35
See application file for complete search history.

(56) References Cited

U.S. PATENT DOCUMENTS

| | | |
|---|---|---|
| 6,610,447 B2 | 8/2003 | Yan et al. |
| 6,777,137 B2 | 8/2004 | Fisch et al. |
| 6,872,495 B2 | 3/2005 | Schwarzl |
| 6,908,714 B2 | 6/2005 | Yan et al. |
| 6,950,176 B1 | 9/2005 | LaFontaine et al. |
| 6,984,475 B1 | 1/2006 | Levinson et al. |
| 7,153,615 B2 | 12/2006 | Bristol et al. |
| 7,221,516 B2 | 5/2007 | Mann et al. |
| 7,237,914 B2 | 7/2007 | Goldstein |
| 7,282,307 B2 | 10/2007 | Hector et al. |
| 7,390,596 B2 | 6/2008 | Ishibashi et al. |
| 7,713,666 B2 | 5/2010 | Hayashi et al. |
| 7,718,324 B2 | 5/2010 | Hayashi et al. |
| 2005/0277034 A1 | 12/2005 | Mitsui |
| 2006/0008749 A1 | 1/2006 | Sobel et al. |
| 2006/0251973 A1 | 11/2006 | Takaki et al. |
| 2007/0160916 A1 | 7/2007 | Ikuta et al. |
| 2008/0248409 A1 | 10/2008 | Ishibashi et al. |

(Continued)

FOREIGN PATENT DOCUMENTS

EP  1 498 936 A1  1/2005

(Continued)

OTHER PUBLICATIONS

U.S. Appl. No. 12/952,254, filed Nov. 23, 2010, Hayashi.

(Continued)

*Primary Examiner* — Stephen Rosasco
(74) *Attorney, Agent, or Firm* — Oblon, Spivak, McClelland, Maier & Neustadt, L.L.P.

(57) ABSTRACT

A reflective mask blank for EUV lithography is provided which has an absorber layer wherein stress and crystal structure can be easily controlled.

A reflective mask blank for EUV lithography, which comprises a substrate, and at least a reflective layer for reflecting EUV light and an absorber layer for absorbing EUV light formed in this order on the substrate, wherein the absorber layer contains tantalum (Ta), nitrogen (N) and hydrogen (H); and in the absorber layer, the total content of Ta and N is from 50 to 99.9 at %, and the content of H is from 0.1 to 50 at %.

24 Claims, 1 Drawing Sheet

U.S. PATENT DOCUMENTS

| | | |
|---|---|---|
| 2008/0318140 A1 | 12/2008 | Hayashi et al. |
| 2009/0011341 A1 | 1/2009 | Hayashi et al. |
| 2009/0130574 A1 | 5/2009 | Hayashi et al. |
| 2010/0035165 A1 | 2/2010 | Hayashi et al. |
| 2010/0167187 A1 | 7/2010 | Ikuta et al. |

FOREIGN PATENT DOCUMENTS

| | | |
|---|---|---|
| JP | 2001-185479 | 7/2001 |
| JP | 2004-006798 | 1/2004 |
| JP | 2004-006799 | 1/2004 |
| JP | 2005-345737 | 12/2005 |
| JP | 2007-335908 | 12/2007 |
| WO | WO 2007/123263 A1 | 11/2007 |
| WO | WO 2007/142365 A1 | 12/2007 |

OTHER PUBLICATIONS

U.S. Appl. No. 13/004,081, filed Jan. 11, 2011, Hayashi, et al.
Supplementary Search Report issued Mar. 28, 2011, in European Patent Application No. 09721613.9-2222 / 2256789.
Tsutomu Shoki, et al., "Process Development of 6-inch EUV mask with TaBN Absorber", Proceedings of SPIE, XP-002439412, vol. 4754, Jan. 1, 2002, pp. 857-864.
M. Takahashi, et al., "Smooth, low-Stress, Sputtered Tantalum and Tantalum Alloy Films for the Absorber Material of Reflective-Type EUVL", Proceedings of SPIE, XP-008008100, vol. 3997, Feb. 28, 2000, pp. 484-495.
M. Takahashi, et al., "Tantalum Nitride Films for the Absorber Material of Reflective-Type EUVL Mask", Proceedings of SPIE, XP-008008080, vol. 4343, Feb. 27, 2001, pp. 760-770.
U.S. Appl. No. 13/070,728, filed Mar. 24, 2011, Hayashi.

REFLECTIVE MASK BLANK FOR EUV LITHOGRAPHY

TECHNICAL FIELD

The present invention relates to a reflective mask blank for EUV (Extreme Ultraviolet) lithography (hereinafter referred to as "an EUV mask blank" in this specification) to be used for e.g. production of semiconductors.

BACKGROUND ART

Heretofore, in the semiconductor industry, a photolithography method employing visible light or ultraviolet light has been used as a technology to transfer a fine pattern required for forming an integrated circuit made of a fine pattern on e.g. a Si substrate. However, the conventional photolithography method is approaching its limit, while miniaturization of semiconductor devices has been accelerated. In the case of the photolithography method, the resolution limit of a pattern is at a level of ½ of the exposure wavelength, and even when a liquid immersion method is employed, it is said to be at a level of ¼ of the exposure wavelength. Accordingly, even when an immersion method by an ArF laser (193 nm) is employed, the resolution limit is expected to be at a level of 45 nm. Therefore, as an exposure technique with 45 nm or shorter, EUV lithography is expected to be promising, which is an exposure technique employing EUV light having a wavelength further shorter than the ArF laser. In this specification, EUV light means light having a wavelength in a soft X-ray region or in a vacuum ultraviolet region, and specifically, it means light with a wavelength of from about 10 to 20 nm, particularly at a level of 13.5 nm±0.3 nm.

EUV light is likely to be readily absorbed by all materials, and the refractive indices of the materials at this wavelength are close to 1, whereby it is not possible to use a refracting optical system as used in a conventional photolithography employing visible light or ultraviolet light. Accordingly, in the EUV lithography, a reflecting optical system i.e. a reflective photomask and a mirror are used.

A mask blank is a laminate prior to patterning, to be used for the production of a photomask.

In the case of an EUV mask blank, it has a structure wherein a reflective layer for reflecting EUV light and an absorber layer for absorbing EUV light are formed in this order on a substrate of e.g. glass. As the reflective layer, a multilayer reflective film is usually employed wherein a high refractive layer and a low refractive layer are alternately laminated to improve the light reflectance when the layer surface is irradiated with EUV light. For the absorber layer, a material having a high absorption coefficient for EUV light, specifically e.g. a material containing Cr or Ta as the main component, is employed.

Patent Document 1 discloses that a nitride of a tantalum/boron alloy (TaBN), an oxide of a tantalum/boron alloy (TaBO) and an oxynitride of a tantalum/boron alloy (TaBNO) are preferred as a material for the absorber layer, since they have not only a high absorption coefficient for EUV light but also a low reflectance of a far ultraviolet light in a wavelength region (190 nm to 260 nm) of the light for inspection of a pattern.

Further, Patent Documents 1 and 2 disclose that the crystalline state of the absorber layer is preferably amorphous in order to make the absorber layer surface to be a surface excellent in smoothness, and in order to make the crystalline state of the TaBN film, the TaBO film and the TaBNO film to be amorphous, the content of B in these films is preferably from 5 to 25 at % (atomic percent).

Further, in Patent Document 3, a TaN film is formed by an ion beam sputtering method, and the stress adjustment is carried out by using xenon (Xe) as the sputtering gas.

Patent Document 1: JP-A-2004-6798 (U.S. Pat. No. 7,390,596 and U.S. Patent Application Publication No. 2008/0248409)

Patent Document 2: JP-A-2004-6799 (U.S. Pat. No. 7,390,596 and U.S. Patent Application Publication No. 2008/0248409)

Patent Document 3: U.S. Patent Application Publication No. 2006/0008749

DISCLOSURE OF THE INVENTION

Problems to be Solved by the Invention

However, in a case where the absorber layer is made of a TaBO film or a TaBNO film, if the content of O in the film increases, the insulating property of the absorber layer increases, whereby charge up takes place at the time of electron beam patterning on the absorber layer, such being undesirable.

On the other hand, in a case where the absorber layer is made of a TaBN film, there will be no substantial possibility of such charge up during the electron beam patterning.

In a case where the absorber layer is made of a TaBN film, film-formation is carried out in many cases by using a magnetron sputtering method as a method where, defects are less likely to result. In such a case, it is possible to form a TaBN film by using e.g. a Ta target and a B target and letting these targets simultaneously discharge in a nitrogen atmosphere. Otherwise, it is also possible to form a TaBN film by using a TaB compound target and letting the compound target discharge in a nitrogen atmosphere.

However, in the case of the method of employing e.g. a Ta target and a B target, the B target has a high ohmic value and is a light element, and accordingly, its film deposition rate is in many cases less than 1/10 as compared with the Ta target. Therefore, in order to increase the content of B to a level (at least 5 at %) required to make the crystalline state of the film to be amorphous, as disclosed in Patent Document 1, it is necessary to lower the film deposition rate of the Ta target, such being undesirable, since the production efficiency will thereby be substantially decreased.

On the other hand, in the method of employing the TaB compound target, when e.g. a compound target comprising 20 at % of B and 80 at % of Ta, is used, the maximum content of B to be actually incorporated in the film will be at a level of 6 at %, and it is difficult to control the content of B in the film to be at least 5 at %. Further, when N is added, the content of B in the film will be at most 4 at %, whereby the crystalline state of the film can hardly be made amorphous.

In order to solve such a problem, it is conceivable to increase the content of B in the film by further increasing the B content in the TaB compound target (e.g. 50 at % of B and 50 at % of Ta). However, as the B content in the TaB target increases, the density of the target tends to be low, whereby the processability tends to be poor. Further, the ohmic value of the TaB target tends to increase, whereby the discharge tends to be unstable, and the film deposition rate tends to be slow. If the discharge becomes unstable, the composition or thickness of the film is likely to fluctuate, and in some cases, film deposition may be impossible.

Whereas, in a case where a TaN film is formed by an ion beam sputtering method employing Xe gas, as disclosed in Patent Document 3, Xe gas is expensive, and the cost for the production of an EUV mask blank tends to be expensive, such being undesirable.

In order to solve the above-mentioned problems of the prior art, it is an object of the present invention to provide an EUV mask blank having an absorber layer which is excellent in the properties as an EUV mask blank, particularly one whereby the stress and crystal structure can be controlled by a method which is more simple and inexpensive than ever.

Means to Solve the Problems

The present inventors have conducted an extensive study to solve the above problems and as a result, have found that by making an absorber layer to be a film (TaNH film) containing Ta, N and H and defining the contents of the respective components, the crystalline state of the film can be made amorphous, and the stress and surface roughness can be reduced.

The present invention has been made on the basis of such a discovery and provides a reflective mask blank for EUV lithography, comprising:
a substrate;
a reflective layer for reflecting EUV light over the substrate; and
an absorber layer for absorbing EUV light formed in this order over the substrate;
wherein the absorber layer contains tantalum (Ta), nitrogen (N) and hydrogen (H); and
the total content of Ta and N is from 50 to 99.9 at %, and the content of H is from 0.1 to 50 at % in the absorber layer.

In the EUV mask blank of the present invention, it is preferred that the absorber layer has a compositional ratio of Ta to N being Ta:N=9:1 to 3:7.

In the EUV mask blank of the present invention, it is preferred that the absorber layer has a total content of B, Si and Ge of at most 5 at %.

In the EUV mask blank of the present invention, it is preferred that the crystalline state of the absorber layer is amorphous.

Further, in the EUV mask blank of the present invention, it is preferred that the absorber layer surface has a surface roughness (rms) of at most 0.5 nm.

Further, in the EUV mask blank of the present invention, it is preferred that the absorber layer has a thickness of from 50 to 200 nm.

The EUV mask blank of the present invention is preferably such that a low reflection layer to an inspection light to be used for inspection of a mask pattern, is formed on the absorber layer, the low reflection layer contains tantalum (Ta) and oxygen (O), and in the low reflection layer, the Ta content is preferably from 10 to 80 at %, and the content of O is preferably from 20 to 90 at %.

Further, the EUV mask blank of the present invention is preferably such that a low reflection layer to an inspection light to be used for inspection of a mask pattern, is formed on the absorber layer, and the low reflection layer contains tantalum (Ta), oxygen (O) and nitrogen (N), and in the low reflection layer, the Ta content is from 10 to 80 at %, the total content of O and N is from 20 to 90 at %, and the compositional ratio of O to N is from 19:1 to 1:19.

Further, in a case where the low reflection layer is formed on the absorber layer, it is preferred that the low reflection layer surface has a surface roughness (rms) of at most 0.5 nm.

Further, in a case where the low reflection layer is formed on the absorber layer, it is preferred that the low reflection layer has a thickness of from 5 to 30 nm.

Further, the EUV mask blank of the present invention is preferably such that a protective layer for protecting the reflective layer at the time of forming a pattern on the absorber layer, is formed between the reflective layer and the absorber layer, and the contrast between the reflected light at the protective layer surface and the reflected light at the low reflection layer surface, to the wavelength of light to be used for inspection of a pattern formed on the absorber layer, is at least 30%.

In a case where the protective layer is formed between the reflective layer and the absorber layer, it is preferred that the protective layer is formed of any one member selected from the group consisting of Ru, a Ru compound, $SiO_2$ and CrN.

In a case where the low reflection layer is formed on the absorber layer, it is preferred that the reflectance at the low reflection layer surface to the wavelength of light to be used for inspection of a pattern formed on the absorber layer, is at most 15%.

The EUV mask blank of the present invention is preferably such that the absorber layer is formed by carrying out a sputtering method employing a Ta target in a atmosphere comprising an inert gas containing at least one member selected from the group consisting of helium (He), argon (Ar), neon (Ne), krypton (Kr) and xenon (Xe), nitrogen ($N_2$) and hydrogen ($H_2$).

Further, the present invention provides a method for producing a reflective mask blank for EUV lithography, comprising: forming a reflective layer for reflecting EUV light, over a substrate; and then, forming an absorber layer over the reflective layer, wherein the absorber layer is formed by carrying out a sputtering method employing a Ta target in an atmosphere comprising an inert gas containing at least one member selected from the group consisting of helium (He), argon (Ar), neon (Ne), krypton (Kr) and xenon (Xe), nitrogen ($N_2$) and hydrogen ($H_2$).

ADVANTAGEOUS EFFECTS OF THE INVENTION

The EUV mask blank of the present invention is characterized in that simply by adding inexpensive hydrogen gas ($H_2$), it is possible to adjust the stress of the absorber layer, and the crystalline state of the absorber layer is amorphous, whereby the absorber layer surface is excellent in smoothness. As a result, a pattern to be formed on the absorber layer is free from an increase of edge roughness and free from deterioration of the dimensional precision of the pattern.

Further, at the time of producing the EUV mask blank, it is not necessary to use a complex mechanism such as a substrate-heating mechanism, a bias mechanism or an ion-assisting mechanism, whereby reduction of defects in the EUV mask blank to be produced, can be expected.

MEANINGS OF SYMBOLS

1: EUV mask blank
11: Substrate
12: Reflective layer (multilayered reflective film)
13: Protective layer 14: Absorber layer
15: Low reflection layer

BEST MODE FOR CARRYING OUT THE INVENTION

Now, the EUV mask blank of the present invention will be described with to reference to the drawings.

Figure 1:
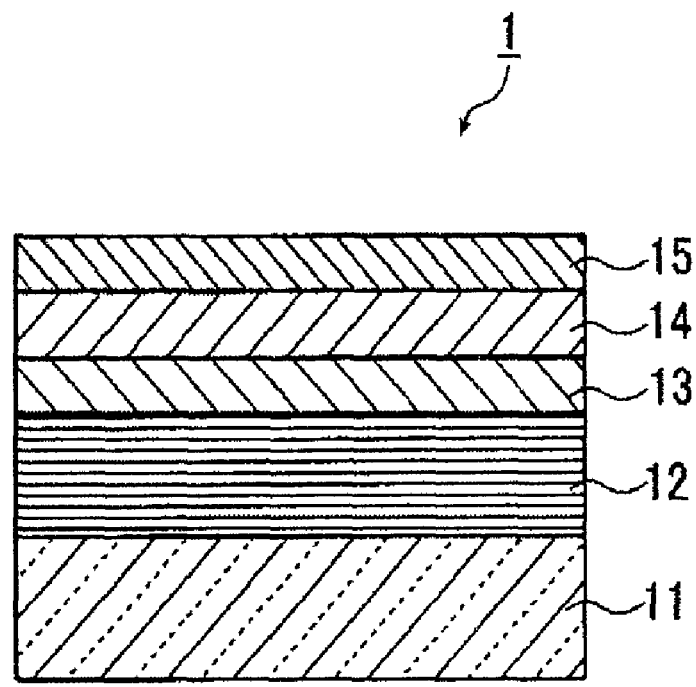
FIG. 1 is a schematic cross-sectional view illustrating one embodiment of the EUV mask blank of the present invention.

FIG. 1 is a schematic cross-sectional view illustrating an embodiment of the EUV mask blank 1 of the present invention. The mask blank 1 shown in FIG. 1 has a reflective layer 12 for reflecting EUV light and an absorber layer 14 for absorbing EUV light, formed in this order on one side of a substrate 11. Between the reflective layer 12 and the absorber layer 14, a protective layer 13 is formed for protecting the reflective layer 12 at the time of forming a pattern on the absorber layer 14. On the absorber layer 14, a low reflection layer 15 to an inspection light to be used for inspection of a mask pattern, is formed. However, in the EUV mask blank 1 of the present invention, in the construction shown in FIG. 1, only the substrate 11, the reflective layer 12 and the absorber layer 14 are essential, and the protective layer 13 and the low reflection layer 15 are optional constituting elements. Further, a conductive film (not shown) may be formed on the side of the substrate 11 opposite to the side on which the reflective layer 12 is formed, and at the time of forming the reflective layer, the protective layer, the absorber layer and the low reflection layer on the substrate 11, the substrate 11 is secured to an electrostatic chuck via the conductive film.

Now, the individual constituting elements of the mask blank 1 will be described.

The substrate 11 is required to satisfy the properties as a substrate for an EUV mask blank.

Therefore, the substrate 11 is preferably one having a low thermal expansion coefficient (specifically, a thermal expansion coefficient at 20° C. of preferably $0\pm0.05\times10^{-7}/°$ C., particularly preferably $0\pm0.03\times10^{-7}/°$ C.) and being excellent in smoothness, flatness and durability against a cleaning fluid to be used for e.g. cleaning of the mask blank or a photomask after forming a pattern. As such a substrate 11, specifically, a glass having a low thermal expansion coefficient such as a $SiO_2$—$TiO_2$ type glass is used, but the substrate is not limited thereto, and a substrate of e.g. crystallized glass having a β-quartz solid solution precipitated, quartz glass, silicon or a metal, may also be employed.

The substrate 11 preferably has a smooth surface with a surface roughness (rms) of at most 0.15 nm and a flatness of at most 100 nm, whereby in a photomask after forming a pattern, a high reflectance and transfer precision can be obtained.

The size, thickness, etc. of the substrate 11 are optionally determined depending upon e.g. designed values of a mask. In Examples given hereinafter, a $SiO_2$—$TiO_2$ type glass having a size of 6 inch (152 mm) square and a thickness of 0.25 inch (6.3 mm) was used.

It is preferred that no defects are present on the surface of the substrate 11 on which the reflective layer 12 is to be formed. In a case where concave defects and/or convex defects are present, it is preferred that the depth of the concave defects and the height of the convex defects are not more than 2 nm, and the half-value width of such concave and convex defects is not more than 60 nm, so that no phase defects will result from such concave and/or convex defects.

The material for a substrate preferably employed in the present invention, is preferably a glass, specifically preferably a $TiO_2$—$SiO_2$ glass (a silica glass containing $TiO_2$). The $TiO_2$—$SiO_2$ glass is known to be such that the thermal expansion coefficient (CTE) is changed by the concentration of $TiO_2$ contained. For example, the thermal expansion coefficient of a $TiO_2$—$SiO_2$ glass containing about 7 mass % of $TiO_2$ becomes substantially 0 at 22° C., and the thermal expansion coefficient of a $TiO_2$—$SiO_2$ glass containing about 7.5 mass % of $TiO_2$ becomes substantially 0 at 50° C. The content of $TiO_2$ is from 1 to 12 mass %, since if the content of $TiO_2$ is less than 1 mass %, the thermal expansion coefficient may not become 0, and if it exceeds 12 mass %, the thermal expansion coefficient may become negative. The content of $TiO_2$ is preferably from 5 to 9 mass %, more preferably from 6 to 8 mass %.

The chlorine concentration in the $TiO_2$—$SiO_2$ glass is preferably at most 50 ppm, more preferably at most 20 ppm, further preferably at most 10 ppm. It is particularly preferred that substantially no chlorine is contained in the $TiO_2$—$SiO_2$ glass. Further, the fluorine concentration in the $TiO_2$—$SiO_2$ glass is preferably at least 100 ppm, more preferably at least 200 ppm, further preferably at least 500 ppm. The fluorine concentration is preferably at most 1 mass %. When the fluorine concentration is within the above range, the viscosity of the glass can be lowered, and it becomes possible to reduce striae to be formed on the glass. Further, the boron concentration in the $TiO_2$—$SiO_2$ glass is preferably at least 10 ppb, more preferably at least 100 ppb, further preferably at least 1 ppm. The boron concentration is preferably at most 1 mass %. When the boron concentration is within the above range, the viscosity of the glass can be lowered, and it becomes possible to reduce striae to be formed on the glass.

The $Ti^{3+}$ concentration in the $TiO_2$—$SiO_2$ glass is preferably at most 70 ppm, more preferably at most 30 ppm, further preferably at most 10 ppm. It is preferred to lower the $Ti^{3+}$ concentration, since the transmittance at a wavelength of the power source to be used for measuring the flatness will thereby be improved.

At the time of carrying out EUVL (EUV exposure), the dimension or shape of an optical component such as a mirror may be changed by a temperature change. To prevent such a change, the interior of the chamber for exposure is preferably controlled to be 22±3° C. Accordingly, the temperature of the substrate is also controlled to be 22±3° C., and COT (the temperature at which the thermal expansion coefficient (CTE) becomes 0 ppb/° C. (cross-over temperature)) of the glass as the material for the substrate is preferably 22±3° C. Here, COT means COT for thermal expansion of the entire surface quality region of the substrate. Here, "the surface quality region of the substrate" is a region to satisfy the performance as an EUV mask, specifically a portion corresponding to about 5 mm inward from the edge.

Further, it is expected that in future, when the power of the exposure light source is increased for the purpose of improving the through put, it becomes difficult to control the temperature to be 22±3° C., and the temperature of the substrate will also be increased. In such a case, COT of the glass is preferably from 40 to 110° C., more preferably from 45 to 100° C., particularly preferably from 50 to 80° C. In order to adjust COT to be from 40 to 110° C., the content of $TiO_2$ in the substrate is preferably at least 7.5 mass %. On the other hand, if the $TiO_2$ content exceeds 12 mass %, COT is likely to exceed 110° C., the thermal expansion is likely to be negative expansion within a range of from −150 to 200° C., crystal such as rutile is likely to precipitate, or bubbles are likely to remain, such being undesirable.

By employing a $TiO_2$—$SiO_2$ glass as the material for a substrate, it is possible to adjust the thermal expansion coefficient to be 0±200 ppb/° C., preferably 0±150 ppb/° C., further preferably 0±125 ppb/° C., in a wide temperature range of from 0 to 100° C. Further, in a case where the fictive temperature of the $TiO_2$—$SiO_2$ glass is lower than 1,000° C., the temperature range wherein the thermal expansion coefficient becomes substantially 0 will be further broadened, and it will be possible to adjust the thermal expansion coefficient to be 0±200 ppb/° C. within a range of from −50 to 150° C.

During the exposure, the EUV mask is preferably maintained at a constant temperature, but a small temperature change takes place naturally. Therefore, over the entire temperature range during the exposure, the average thermal expansion coefficient is preferably 0±30 ppb/° C., more preferably 0±20 ppb/° C., further preferably 0±15 ppb/° C. Further, the total spatial variation of the thermal expansion coefficient of the substrate is preferably at most 10 ppb/° C., more preferably at most 6 ppb/° C., further preferably at most 4 ppb/° C., most preferably at most 3 ppb/° C. The temperature during the exposure is usually from 19 to 25° C. However, as mentioned above, it is recently expected to be slightly higher, and such a possibility that it becomes from 50 to 80° C., has been pointed out. Therefore, it is preferred that the average thermal expansion coefficient of the substrate is within the above range over the entire temperature range of from 50 to 80° C.

The thermal expansion coefficient can be measured usually within a range of from −150 to +200° C. by using a laser interference thermal dilatometer. In order to measure the thermal expansion over the entire surface quality region of the substrate, for example, a relatively large glass having a length of about 100 mm is cut out from the substrate, and the thermal expansion in its longitudinal direction is precisely measured by using a laser heterodyne interference thermal dilatometer CTE-01 manufactured by Uniopt Corporation, Ltd.

Further, in order to measure the total spatial variation of the thermal expansion coefficient, for example, a relatively small glass of about 12 mm is cut out from the substrate, and the thermal expansion coefficient of each small region may be precisely measured by e.g. a laser dilatometer LIX-1, manufactured by ULVAC. For the calculation of the thermal expansion coefficient, it is possible to use a method wherein dimensional changes by temperature changes of from 1 to 3° C. of the particular temperature, are measured and the average thermal expansion coefficient is taken as the thermal expansion coefficient at the intermediate temperature, or a method wherein a thermal expansion curve is obtained by measuring within a relatively wide temperature range of from −150 to +200° C., and the temperature differential value of the thermal expansion curve is taken as the thermal expansion coefficient at each temperature.

The fictive temperature has a relation with the breadth of the temperature range (the zero expansion temperature range) wherein the thermal expansion coefficient becomes substantially zero. That is, if the fictive temperature exceeds 1,200° C., the zero expansion temperature range tends to be narrow, such being not suitable for a material to be used for an EUV mask blank. To broaden the zero expansion temperature range, the fictive temperature is preferably lower than 1,000° C., more preferably lower than 950° C., further preferably lower than 900° C., most preferably lower than 850° C.

In order to obtain a $TiO_2$—$SiO_2$ glass having a fictive temperature of lower than 1,000° C., a method is effective wherein a $TiO_2$—$SiO_2$ glass formed into a prescribed shape is maintained at a temperature of from 800 to 1,200° C. for at least 2 hours and then cooled to at most 700° C. at an average temperature lowering rate of at most 10° C./hr. In order to further lower the fictive temperature, it is preferred to lower the temperature at a rate of 5° C./hr, more preferably at a rate of 3° C./hr. If the temperature is lowered at a lower average temperature lowering rate, a lower fictive temperature can be accomplished. For example, when the temperature is lowered at a rate of at most 1° C./hr, the fictive temperature can be made to be at most 900° C. In such a case, however, the temperature may be lowered at a slow cooling rate, e.g. at a rate of at most 1° C./hr, only within a temperature range of from 1,000° C. to 800° C., and in other temperature ranges, cooling may be made at a cooling rate of at least 5° C./hr, whereby the time can be shortened.

The fictive temperature of the substrate can be measured by a known procedure With respect to a mirror-finished substrate, an absorption spectrum is taken by using an infrared spectrometer (in Examples given hereinafter, Magna 760 manufactured by Nikolet was used). At that time, data intervals are set to be about 0.5 cm$^{-1}$, and as the absorption spectrum, an average value of scanning 64 times is employed. In the infrared absorption spectrum thus obtained, a peak observed in the vicinity of about 2,260 cm$^{-1}$ is attributable to the harmonic overtone of stretching vibration by a Si—O—Si bond of the $TiO_2$—$SiO_2$ glass. By using such a peak position, a calibration curve is prepared by a glass having the same composition having a known fictive temperature, and the fictive temperature is determined. Otherwise, the reflection spectrum of the surface is measured in the same manner by using a similar infrared spectrometer. In an infrared reflection spectrum thus obtained, a peak observed in the vicinity of about 1,120 cm$^{-1}$ is attributable to stretching vibration by a Si—O—Si bond of the $TiO_2$—$SiO_2$ glass. Using such a peak position, a calibration curve is prepared by a glass having the same composition having a known fictive temperature, and the fictive temperature is determined. Here, a shift of the peak position due to a change in the glass composition can be extraporated from the composition dependency of the calibration curve.

In the present invention, the concentration of hydrogen molecules in the glass constituting the substrate is preferably at least $5 \times 10^{16}$ molecules/cm$^3$, more preferably at least $8 \times 10^{16}$ molecules/cm$^3$. By increasing the hydrogen concentration, it is possible to prevent contamination with e.g. carbon during the exposure, and by reducing the film formed on the substrate, it becomes possible to prevent deterioration by oxidation of the film. The concentration of hydrogen molecules can be measured by a Raman spectrometric method.

In a case where the $TiO_2$—$SiO_2$ glass of the present invention is prepared by a direct method, it is preferred (1) to increase the concentration of hydrogen molecules during the synthesis, (2) to increase the flame temperature, (3) to increase the deposition surface temperature or (4) to lower the concentration of raw material gas, as compared with a usual condition for synthesis. As a combustion gas, one containing H in its molecular formula is employed, and the O/H ratio in all gases to be supplied is preferably at most 1.5, more preferably at most 1.3. The flame temperature is preferably at least 1,900° C., more preferably at least 2,000° C. The deposition surface temperature is preferably at least 1,800° C., more preferably at least 1,900° C. The concentration of raw material gas in the piping for transporting the raw material gas to a burner is preferably at most 20 vol %, more preferably at most 10 vol %. Among the above four items, it is more preferred to carry out at least two items, and it is further preferred to carry out at least three items. It is particularly preferred to carry out all of them.

In the present invention, the OH group concentration in the glass constituting the substrate is preferably at most 600 ppm, more preferably at most 400 ppm, particularly preferably at most 200 ppm. It is considered that if the OH group concentration is high, the structural relaxation is swift, and in the case of producing a glass body having a large diameter which is likely to have a temperature distribution, a fictive temperature distribution is likely to result.

The OH group concentration is considered to be influential over the structural relaxation of the glass, because the OH groups become end groups to cut off the network in the network structure of the glass. It is considered that the structural relaxation of the glass becomes easy as the number of such end groups increases. That is, the more the OH groups, the shorter the time for structural relaxation, and thus, the fictive temperature tends to be influenced by the temperature distribution in the glass body formed during the cooling.

As a production method to obtain a $TiO_2$—$SiO_2$ glass having a low OH group concentration, a soot method is preferred. The soot method is a production method wherein fine particles (soot) of $TiO_2$—$SiO_2$ glass obtained by subjecting a Si precursor and a Ti precursor as raw materials for forming glass to flame hydrolysis or thermal decomposition, are deposited and then heated to a transparent vitrification temperature to obtain a transparent $TiO_2$—$SiO_2$ glass body. Further, the soot method may, for example, be a MCVD method, an OVD method or a VAD method depending on the manner for preparing the soot. Details will be given hereinafter.

Another method may be a method for preparing a glass body by a direct method as disclosed in U.S. Pat. No. 7,053, 017. Specifically, a silica/titania powder is prepared by flame hydrolysis of a silicon-containing feed material and a titanium-containing feed material; the powder is deposited in a rotating collection cup disposed in the refractory furnace or on the surface of glass present in the furnace; and the powder is solidified to prepare a $TiO_2$—$SiO_2$ glass. In the present invention, the substrate may be produced by either the soot method or the direct method. Further, as another production method, a so-called melting method may also be used.

The OH group concentration can be measured as follows. The absorption spectrum of the $TiO_2$—$SiO_2$ glass is measured by the measurement by an infrared spectrophotometer; and the OH group concentration is obtained from the absorption peak at a wavelength of 2.7 μm of the spectrum. The detection limit by this method is usually about 0.1 ppm.

As a substrate for EUV mask, it is preferred to make the $TiO_2/SiO_2$ compositional ratio in the glass to be constant, whereby the distribution of the thermal expansion coefficient in the substrate can be made small. A variation of this $TiO_2/SiO_2$ compositional ratio is influential over the refractive index of the glass, and accordingly, it is possible to employ the variation range Δn of the refractive index, as an index for the uniformity of the $TiO_2$—$SiO_2$ composition. For the substrate of the present invention, the variation range (Δn) of the refractive index within a range of 30 mm×30 mm in at least one plane is preferably at most $4 \times 10^{-4}$ (400 ppm). If it exceeds $4 \times 10^{-4}$, the surface roughness after the polishing tends to be large, and super-high smoothness may not be obtained. It is more preferably at most $3.5 \times 10^{-4}$ (350 ppm), further preferably at most $3 \times 10^{-4}$ (300 ppm). Especially, in order to attain super-smoothness (surface roughness (rms)≦1 nm), the variation range (Δn) of the refractive index is preferably at most $2 \times 10^{-4}$ (200 ppm), further preferably at most $1 \times 10^{-4}$ (100 ppm), particularly preferably at most $0.5 \times 10^{-4}$ (50 ppm).

As a method for measuring the variation range Δn of the refractive index, a known method such as a method of using an optical interferometer may be used. More specifically, from a transparent $TiO_2$—$SiO_2$ glass body, e.g. a cube of about 40 mm×40 mm×40 mm is cut out, and each face of the cube is sliced in a thickness of about 0.5 mm, followed by polishing to obtain a plate-form $TiO_2$—$SiO_2$ glass block of 30 mm×30 mm×(0.2 to 1) mm. By a small diameter Fizeau interferometer, the surface of 30 mm×30 mm of this glass block is irradiated with a laser beam of e.g. 650±10 nm and magnified to a magnification sufficient for observation of striae, whereupon the refractive index distribution in the plane is examined, and the variation range Δn of the refractive index is measured. In a case where pitches of striae are fine, it is preferred that the thickness of the plate-form $TiO_2$—$SiO_2$ glass block to be measured, is made thin.

As a substrate to be used in the present invention, it is preferred that the fluctuation in the fictive temperature is within 100° C., the fluctuation in the OH group concentration is within 50 ppm, and Δn is within $4 \times 10^{-4}$, whereby the thermal expansion coefficient distribution within about 30 mm×about 30 mm in at least one plane can be made to be within 30 ppb/° C., such being desirable for an EUV mask.

The fluctuation in the fictive temperature is the difference between the maximum value and the minimum value of the fictive temperature within 30 mm×30 mm in one plane. The fluctuation in the fictive temperature can be measured as follows. A transparent $TiO_2$—$SiO_2$ glass body formed into a prescribed size, is sliced to obtain a $TiO_2$—$SiO_2$ glass block of 50 mm×50 mm×1 mm. With respect to the 50 mm×50 mm surface of this $TiO_2$—$SiO_2$ glass block, the fictive temperature is measured at 10 mm pitch intervals in accordance with the above-described method to obtain the fluctuation in the fictive temperature of the shaped $TiO_2$—$SiO_2$ glass body.

In order to produce a $TiO_2$—$SiO_2$ glass as an embodiment of the substrate to be suitably used in the present invention, the following production method may be employed.

Step (a)

A silica precursor and a titania precursor as glass-forming raw materials are subjected to flame hydrolysis to let the obtainable $TiO_2$—$SiO_2$ glass fine particles deposit and grow on a substrate to form a porous $TiO_2$—$SiO_2$ glass body. The glass-forming raw materials are not particularly limited so long as they are raw materials which can be gasified. The silica precursor may, for example, be a silicon halide compound such as a chloride such as $SiCl_4$, $SiHCl_3$, $SiH_2Cl_2$ or $SiH_3Cl$, a fluoride such as $SiF_4$, $SiHF_3$ or $SiH_2F_2$, a bromide such as $SiBr_4$ or $SiHBr_3$, or an iodide such as $SiI_4$, or an alkoxysilane represented by $R_nSi(OR)_{4-n}$ wherein R is a $C_{1-4}$ alkyl group, and n is an integer of from 0 to 3. The titania precursor may, for example, be a titanium halide compound such as $TiCl_4$ or $TiBr_4$, or an alkoxytitanium represented by $R_nTi(OR)_{4-n}$ wherein R is a $C_{1-4}$ alkyl group, and n is an integer of from 0 to 3. Further, as the silica precursor and the titania precursor, a Si and Ti-mixed compound such as a silicon-titanium double alkoxide may also be used.

As the substrate, a seed rod made of quartz glass (e.g. a seed rod disclosed in JP-B-63-24973) may be used. Further, without being limited to a rod-shape, a plate-shaped substrate may be used. At the time of supplying the glass-forming raw materials, it is preferred to stabilize the supply of the glass raw material gases by precisely controlling the temperatures or gas flow rates in the raw material tanks or raw material gas pipes. Further, it is preferred to provide a glass raw material gas-stirring mechanism at an intermediate position in the gas supply system. By such a method, the striae level of the $TiO_2$—$SiO_2$ glass can be reduced, and the striae stress level and the refractive index variation range can be made to be lower than the prescribed levels, such being desirable.

In addition to the stabilization of the supply of the above raw materials, it is preferred to adjust the rotational speed of the seed rod during the formation of the porous $TiO_2$—$SiO_2$ glass body to be at least 25 rpm, more preferably at least 50 rpm, further preferably at least 100 rpm, particularly preferably at least 250 rpm. By rotating the seed rod at a high speed in addition to stabilization or unification of the supply of raw materials in a vapor form, it becomes possible to obtain a $TiO_2$—$SiO_2$ glass with less striae.

Step (b)

The porous $TiO_2$—$SiO_2$ glass body obtained in Step (a) is heated to a densification temperature under a reduced pressure or in a helium atmosphere to obtain a $TiO_2$—$SiO_2$ densified body. The densification temperature is usually from 1,250 to 1,550° C., preferably from 1,300 to 1,500° C. The densification temperature is a temperature at which the porous glass body can be densified until no void space becomes confirmed by an optical microscope.

Step (c)

The $TiO_2$—$SiO_2$ densified body obtained in Step (b) is heated to a transparent vitrification temperature to obtain a transparent $TiO_2$—$SiO_2$ glass body. The transparent vitrification temperature is preferably from 1,350 to 1,800° C., particularly preferably from 1,400 to 1,750° C. The transparent vitrification temperature is a temperature at which a transparent glass is obtained and no crystal becomes confirmed by an optical microscope.

The heating atmosphere is preferably an atmosphere of 100% inert gas such as helium or argon or an atmosphere containing an inert gas such as helium or argon as the main component. The pressure may be reduced pressure or atmospheric pressure. In the case of the reduced pressure, it is preferably at most 13,000 Pa.

Step (d)

The transparent $TiO_2$—$SiO_2$ glass body obtained in Step (c) is heated to a temperature of at least the softening point and formed into a desired shape to obtain a shaped $TiO_2$—$SiO_2$ glass body. The forming temperature is preferably from 1,500 to 1,800° C. If it is lower than 1,500° C., the viscosity of the transparent $TiO_2$—$SiO_2$ glass is high, whereby no substantial deformation by its own weight takes place, or growth of cristobalite being a crystal phase of $SiO_2$ or growth of rutile or anatase being a crystal phase of $TiO_2$ takes place, thus leading to a possibility of so-called devitrification. If it exceeds 1,800° C., sublimation of $SiO_2$ may not be negligible.

Further, in order to make the stress value to be good, it is preferred to carry out forming twice as follows. Firstly, the transparent $TiO_2$—$SiO_2$ glass body is heated to the above-mentioned forming temperature to form a first shaped body, and then, the peripheral portion of the substrate is cut off. The first shaped body having the periphery cut off, is heated to the above-mentioned forming temperature to form a second shaped body. This second forming is preferred in that the concentration gradient becomes large by reducing the intervals of striae, whereby diffusion of components between striae will be facilitated. Further, this method is preferred in that the portion where the stress of striae present in the interior of the glass body is large, can be adjusted to be the peripheral portion. The volume of the first shaped body is at most ¾ of the volume of the second shaped body.

Further, Step (c) and Step (d) may be carried out continuously or simultaneously.

Step (e)

The shaped $TiO_2$—$SiO_2$ glass body obtained in Step (d) is subjected to annealing treatment. Specifically, it is held for at least 1 hour at a temperature of from 800 to 1,200° C., followed by cooling to at most 700° C. at an average cooling rate of at most 10° C./hr to carry out annealing treatment thereby to control the fictive temperature of the $TiO_2$—$SiO_2$ glass. Otherwise, the shaped $TiO_2$—$SiO_2$ glass obtained in Step (d) which is at least 1,200° C., is cooled at an average cooling rate of at most 60° C./hr to 700° C. to carry out annealing treatment thereby to control the fictive temperature of the $TiO_2$—$SiO_2$ glass. After cooling to at most 700° C., the glass body may be left to cool naturally. Such natural cooling can be carried out in an atmosphere of 100% inert gas such as helium, argon or nitrogen, in an atmosphere containing such inert gas as the main component or in an atmosphere of air. The pressure for such natural cooling is preferably a reduced pressure or atmospheric pressure.

Step (f)

The $TiO_2$—$SiO_2$ glass body obtained in Step (e) is held in a hydrogen atmosphere for at least 10 hours at a temperature of from 300 to 1,200° C. to obtain a $TiO_2$—$SiO_2$ glass body containing hydrogen. The atmosphere is preferably an atmosphere of 100% hydrogen or a hydrogen atmosphere containing an inert gas such as helium or argon, wherein the hydrogen partial pressure is at least 0.1 atm, more preferably at least 1 atm, further preferably at least 5 atm. In order to make the distribution of the hydrogen concentration to be good, the holding time is preferably at least 10 hours, more preferably at least 24 hours.

In order to accomplish a lower fictive temperature, it is effective to carry out the cooling at a lower cooling rate in a temperature range in the vicinity of the strain point or annealing point of glass. Specifically, in the cooling profile in Step (e), the lowest cooling rate is preferably at most 10° C./hr, more preferably at most 5° C./hr, more preferably at most 3° C./hr, particularly preferably at most 1° C./hr.

The $TiO_2$—$SiO_2$ glass of the present invention preferably has no inclusion. The inclusion is e.g. a foreign matter of bubbles present in the glass. The foreign matter is likely to be formed by contamination or crystal precipitation in the glass production process. In order to eliminate inclusion of such a foreign matter or bubbles, it is preferred to control contamination particularly in Step (a) and further accurately control the temperature conditions in Steps (b) to (d), in the above production process.

The reflective layer 12 is not particularly limited so long as it has the desired properties as a reflective layer for an EUV mask blank. Here, the properties particularly required for the reflective layer 12 are such that it has a high EUV light reflectance and the surface roughness is small. Specifically, when the surface of the reflective layer 12 is irradiated with light in a wavelength region of EUV light at an incident angle of 6°, the maximum value of the light reflectance in the vicinity of the wavelength of 13.5 nm is preferably at least 60%, more preferably at least 65%. Further, even in a case where the protective layer 13 is provided on the reflective layer 12, the maximum value of the light reflectance in the vicinity of a wavelength of 13.5 nm is preferably at least 60%, more preferably at least 65%. If the surface roughness (rms) of the surface of the reflective layer 12 is large, the EUV light on the surface of the reflective layer 12 is scattered, and the reflectance is likely to be low. When the surface roughness (rms) of the surface of the reflective layer 12 is at least 0.5 nm, the surface of the reflective layer 12 is sufficiently smooth, and the scattering effect by the surface roughness is small, and a sufficient reflectance can be obtained. The surface roughness (rms) of the surface of the reflective layer 12 is more preferably at most 0.4 nm, further preferably at most 0.3 nm. Further, even in a case where a protective layer 13 is provided on the reflective layer 12, the surface roughness (rms) of the surface of the protective layer 13 is preferably at most 0.5 nm, more preferably at most 0.4 nm, further preferably at most 0.3 nm.

As the reflective layer 12, it is common to employ a multilayered reflective film having a high refractive index layer and a low refractive index layer alternately laminated a plurality of times, since it is thereby possible to accomplish a high EUV light transmittance. In the multilayered reflective film constituting the reflective layer 12, Mo is widely used for the high refractive index layer, and Si is widely used for the low refractive index layer. That is, a Mo/Si multilayered reflective film is most common. However, the multilayered reflective film is not limited thereto, and a Ru/Si multilayered reflective film, a Mo/Be multilayered reflective film, a Mo compound/Si compound multilayered reflective film, a Si/Mo/Ru multilayered reflective film, a Si/Mo/Ru/Mo multilayered reflective film or Si/Ru/Mo/RU multilayered reflective film may also be employed.

The thickness of each layer and the number of repeating units of each layer constituting the multilayered reflection film being the reflective layer 12, may suitably be selected depending upon the film materials to be used and the EUV light transmittance required for the reflective layer. For example, in the case of a Mo/Si reflective film, in order to obtain a reflective film 12 having the maximum value of the EUV light transmittance being at least 60%, the multilayered reflective film may be obtained by laminating a Mo layer having a thickness of 2.3±0.1 nm and a Si layer having a thickness of 4.5±0.1 mm so that the number of repeating units will be from 30 to 60.

Here, each layer constituting the multilayered reflective film being the reflective layer 12 may be formed by using a well-known film-forming method such as a magnetron sputtering method or an ion beam sputtering method so that the desired thickness is obtained. For example, in the case of forming a Si/Mo multilayered reflective film by using an ion beam sputtering method, preferred film-forming conditions are as follows. Firstly, by using a Si target as the target and Ar gas (gas pressure: $1.3 \times 10^{-2}$ Pa to $2.7 \times 10^{-2}$ Pa) as a sputtering gas, a Si film is formed at an ion acceleration voltage of from 300 to 1,500 V at a film forming rate of from 0.03 to 0.30 nm/sec so that the thickness will be 4.5 nm. Then, using a Mo target as the target and Ar gas (gas pressure: $1.3 \times 10^{-2}$ Pa to $2.7 \times 10^{-2}$ Pa) as the sputtering gas, a Mo film is formed at an ion acceleration voltage of from 300 to 1,500 V at a film-forming rate of from 0.03 to 0.30 nm/sec so that the thickness will be 2.3 nm. This procedure is taken as one cycle, and a Si/Mo multilayered reflective film is formed by laminating the Si film and the Mo film for from 40 to 50 cycles. Here, the Si target may be doped with B (boron) in order to lower the specific resistance of the target.

In order to prevent the surface of the reflective layer 12 from being oxidized, the uppermost layer of the multilayered reflective film constituting the reflective layer 12 is preferably a layer made of a material which is hardly oxidized. The layer made of a material which is hardly oxidized, will function as a cap layer for the reflective layer 12. A Si layer may, for example, be mentioned as a specific example of the layer made of a material which is hardly oxidized and which will function as a cap layer. In a case where the multilayered reflective film constituting the reflective layer 12 is a Si/Mo film, by constituting the uppermost layer by a Si layer, it is possible to let the uppermost layer function as a cap layer. In such a case, the thickness of the cap layer is preferably 11±2 nm.

The protective layer 13 is provided for the purpose of protecting the reflective layer 12 so that the reflective layer 12 will not be damaged by an etching process at the time of forming a pattern on the absorber layer 14 by the etching process which is usually a dry etching process. Therefore, the material for the protective layer 13 is selected to be a material which is less susceptible to the etching process of the absorber layer 14 i.e. which has an etching rate slower than the absorber layer 14 and is less susceptible to damage by the etching process. The material which satisfies such conditions may, for example, be Cr, Al, Ta or a nitride thereof; Ru or a Ru compound (such as RuB or RuSi); or $SiO_2$, $Si_3N_4$, $Al_2O_3$ or a mixture thereof. Among them, Ru or a Ru compound (such as RuB or RuSi), CrN or $SiO_2$ is preferred, and Ru or a Ru compound (such as RuB or RuSi) is particularly preferred.

The thickness of the protective layer 13 is preferably from 1 nm to 60 nm, particular preferably from 1 nm to 20 nm. As described later, the absorber layer contains a certain amount of hydrogen. Whereas, the protective layer preferably does not contain hydrogen. The hydrogen content of the protective layer is preferably at most 5 at %, more preferably at most 3 at %, further preferably at most 1 at %. Further, the hydrogen content in the absorber layer is preferably larger by at least 1 at %, more preferably at least 3 at %, further preferably at least 5 at %, than the hydrogen content in the protective layer.

The protective layer 13 is formed by a well known film-forming method such as a magnetron sputtering method or an ion beam sputtering method. In a case where a Ru film is to be formed by a magnetron sputtering method, it is preferred to form a film by using a Ru target as the target, and Ar gas (gas pressure: $1.0 \times 10^{-2}$ Pa to $10 \times 10^{-1}$ Pa) as the sputtering gas at an applied voltage of from 30 V to 1,500 V at a film-forming rate of from 0.02 to 1.0 nm/sec, so that the thickness will be from 2 to 5 nm.

The property required particularly for the absorber layer 14 is such that the EUV light reflectance is very low. Specifically, when the surface of the absorber layer 14 is irradiated with light within a wavelength region of EUV light, the maximum light reflectance in the vicinity of a wavelength of 13.5 nm is preferably at most 0.5%, more preferably at most 0.1%. Further, the absorber layer may sometimes be required to have properties such as a low stress, an amorphous structure and a small surface roughness. The surface roughness (rms) of the absorber layer 14 is preferably at most 0.5 nm, particularly preferably at most 0.4 nm.

In order to accomplish the above properties, the absorber layer is preferably constructed by a material having a high EUV light absorption coefficient.

The absorber layer 14 of the EUV mask blank 1 of the present invention accomplishes the above properties by containing tantalum (Ta), nitrogen (N) and hydrogen (H) in the following specific ratio.

The content of H in the absorber layer 14 is from 0.1 to 50 at %. If the content of H in the absorber layer 14 is less than 0.1 at %, the crystalline state of the absorber layer 14 tends to be hardly amorphous, and the effect for reducing the stress also tends to be low. If the content of H in the absorber layer 14 exceeds 50 at %, although the layer may be made to be amorphous, no adequate low reflection effect can be obtained to the pattern-inspection light due to excessive hydrogenation of the film, and the electrical conductivity of the film tends to be low, thus leading to a problem such as charge up at the time of forming a pattern. Further, the UV absorption property tends to deteriorate, such being undesirable.

In the EUV mask blank of the present invention, when the H content in the absorber layer 14 is within the above range, the crystalline state of the absorber layer tends to be readily amorphous, and the absorber surface will be excellent in smoothness.

The content of H in the absorber layer 14 is preferably from 2 to 50 at %, more preferably from 2 to 10 at %, particularly preferably from 2 to 5 at %, and further, preferably from 0.1 to 30 at %, more preferably from 0.2 to 10 at %, further preferably from 0.3 to 5 at %.

However, as is different from the absorber layer, in the low reflectance layer, the content of H is preferably at most 5 at %, more preferably at most 3 at %, further preferably at most 1 at %. Further, it is preferred that the hydrogen content in the absorber layer is higher by at least 1 at %, more preferably at least 3 at %, further preferably at least 5 at %, than the hydrogen content in the low reflection layer.

According to the present invention, it is possible to make the crystalline state of the absorber layer to be amorphous without using an element known to contribute to make a metal crystal amorphous, such as B or Si. As an element known to contribute to make the metal crystal amorphous, Ge maybe mentioned in addition to B or Si. Such an element is one to contribute to make metal crystal amorphous, but when incorporated to the absorber layer, it creates an unavoidable problem. For example, when B is incorporated, the ohmic value of the target to be used for film formation becomes large, whereby the discharge tends to be unstable, and the film forming rate tends to be low. As the discharge becomes unstable, there may be fluctuations in the composition of the film or the film thickness, and in an extreme case, it becomes impossible to form a film. Further, in a case where Si is incorporated, since the EUV absorption coefficient of Si is small, there will be a problem such that the EUV light absorbing property of the absorber layer tends to be low.

Thus, the absorber layer 14 preferably contains substantially no B, Si or Ge, and the total content of such elements is preferably at most 5 at %. The total content of such elements is more preferably at most 4 at %, further preferably at most 3 at %.

Further, in a case where an additive to a metal crystal is to be studied, particularly in a case where addition of a light element is considered, when the additive is O (oxygen), it is possible that depending upon its concentration, there may be a problem as mentioned above, such as charge up or instability of the discharge during the film formation or a problem in the processability of the target. Further, in a case where C is to be added, the C component may be incorporated to a target or C may be incorporated as a gas component during the film formation (such as $SO_2$ or $C_XH_Y$), C itself tends to be a contamination and becomes a defect of the mask blank, such being undesirable. That is, the nature of the absorber layer may be different depending on the additive, and some additives may not satisfy the nature as an absorber layer. The total content of O and C in the absorber layer is preferably at most 5 at %, more preferably at most 3 at %, further preferably at most 1 at %.

In the absorber layer 14, the rest excluding H is preferably Ta and N. Accordingly, the total content of Ta and N in the absorber layer 14 is preferably from 50 to 99.9 at %, particularly preferably from 50 to 98 at %. The total content of Ta and N in the absorber layer 14 is preferably from 50 to 98 at %, more preferably from 90 to 98 at %, particularly preferably from 95 to 98 at %, further preferably from 70 to 99.9 at %, more preferably from 90 to 99.8 at %, particularly preferably from 95 to 99.7 at %. The compositional ratio of Ta to N is preferably from 9:1 to 3:7. The compositional ratio of Ta to N is more preferably from 8:2 to 4:6, further preferably from 7:3 to 4:6, particularly preferably from 7:3 to 5:5.

The absorber layer 14 preferably has the above structure, whereby the crystalline state is amorphous. In this specification, "the crystalline state is amorphous" includes one having a fine crystal structure in addition to one having an amorphous structure and no crystal structure. When the absorber layer 14 is a film having an amorphous structure or a film having a fine crystal structure, the surface of the absorber layer 14 is excellent in smoothness.

In the EUV mask blank 1 of the present invention, it is preferred that the absorber layer 14 is a film having an amorphous structure or a film having a fine crystal structure, whereby the surface roughness (rms) of the surface of the absorber layer 14 is at most 0.5 nm. Here, the surface roughness of the surface of the absorber layer 14 can be measured by using an atomic force microscope. If the surface roughness of the surface of the absorber layer 14 is large, the edge roughness of the pattern to be formed on the absorber layer 14 tends to be large, whereby the dimensional precision of the pattern deteriorates. As the pattern becomes fine, the influence of the edge roughness tends to be distinct, and accordingly, the surface of the absorber layer 14 is required to be smooth.

When the surface roughness (rms) of the surface of the absorber layer 14 is at most 0.5 nm, the surface of the absorber layer 14 is sufficiently smooth, and there is no worry for deterioration of the dimensional precision of the pattern due to an influence of the edge roughness. The surface roughness (rms) of the surface of the absorber layer 14 is more preferably at most 0.4 nm, further preferably at most 0.3 nm.

Further, the crystalline state of the absorber layer 14 being amorphous i.e. being an amorphous structure or a fine crystal structure, can be confirmed by an X-ray diffraction (XRD) method. When the crystalline state of the absorber layer 14 is an amorphous structure or fine crystal structure, no sharp peak will be observed among the diffraction peaks obtainable by the XRD measurement.

Further, the film stress of the absorber layer 14 is preferably at most 300 MPa, particularly preferably at most 100 MPa, in consideration of the warpage of the substrate or the degree of an influence over other films. Or, it is preferably at most 200 MPa and at least −200 MPa, in consideration of the warpage of the substrate or the influence over other films.

The thickness of the absorber layer 14 is preferably from 50 to 200 nm, more preferably from 50 nm to 100 nm, further preferably from 45 nm to 80 nm.

The absorber 14 having the above-described construction can be formed by carrying out a sputtering method employing a Ta target in an atmosphere comprising an inert gas containing at least one member selected from the group consisting of helium (He), argon (Ar), neon (Ne), Krypton (Kr) and xenon (Xe), nitrogen ($N_2$) and hydrogen ($H_2$).

In order to form the absorber layer 14 by the above method, the method may specifically be carried out under the following film-forming conditions.

Method for Forming Absorber Layer

Sputtering gas: A mixed gas of Ar, $N_2$ and $H_2$ ($H_2$ gas concentration: from 1 to 50 vol %, preferably from 1 to 30 vol %; $N_2$ gas concentration: from 1 to 80 vol %, preferably from 5 to 75 vol %; Ar gas concentration: from 5 to 95 vol %, preferably from 10 to 94 vol %; gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa).

Applied electric power: From 30 to 1,000 W, preferably from 50 to 750 W, more preferably from 80 to 500 W.

Film-forming rate: From 0.5 to 60 nm/min, preferably from 1.0 to 45 nm/min, more preferably from 1.5 to 30 nm/min.

Further, in a case where an inert gas other than argon is to be used, the concentration of such an inert gas is made to be within the same concentration range as the above-mentioned Ar gas concentration. Further, in a case where a plurality of inert gases are to be used, the total concentration of inert gases is made to be within the same concentration range as the above-mentioned Ar gas concentration.

The low reflection layer 15 is constructed by a film which presents a low reflection with an inspection light to be used for inspection of the mask pattern. At the time of preparing an EUV mask, after forming a pattern on the absorber layer, an inspection is carried out to see whether or not this pattern is formed as designed. In the inspection of this mask pattern, an inspecting machine is used wherein as an inspecting light, a light of about 257 nm is usually employed. That is, inspection is made by a difference in the reflectance of light of about 257 nm, specifically by a difference in the reflectance between the surface exposed by removal of the absorber layer 14 by formation of a pattern and the surface of the absorber layer 14 remained without being removed by the formation of the pattern. Here, the former is the surface of the reflective layer 12 or the surface of the protective layer 13, usually the surface of the protective layer 13. Thus, if the difference in the reflectance between the surface of the reflective layer 12 or the surface of the protective layer 13 and the surface of the absorber layer 14, to the wavelength of the inspection light, is small, the contrast in the inspection tends to be poor, and accurate inspection may not be carried out.

The absorber layer 14 having the above-described construction has an extremely low EUV light reflectance and has an excellent property as an absorber layer for the EUV mask blank 1, but as observed with respect to the wavelength of the inspection light, the light reflectance may not necessarily be sufficient. As a result, the difference between the reflectance at the surface of the absorber layer 14 at an wavelength of the inspection light and the reflectance at the surface of the reflective layer 12 or at the surface of the protective layer 13, tends to be small, and no adequate contrast may be obtained at the time of the inspection. If no adequate contrast is obtained at the time of the inspection, a defect of the pattern cannot sufficiently be determined in the inspection of the mask, and accurate inspection of a defect may not be carried out.

In the EUV mask blank 1 of the present invention, a low reflection layer 15 to an inspection light, is formed on the absorber layer 14, whereby the light reflectance at the wavelength of the inspection light becomes extremely low, and the contrast at the time of the inspection will be good. Specifically, when the surface of the low reflection layer 15 is irradiated with a light within a wavelength region of the inspection light, the maximum light reflectance at the wavelength of the inspection light is preferably at most 15%, more preferably at most 10%, further preferably at most 5%.

When the light reflectance of the wavelength of the inspection light at the low reflection layer 15 is at most 15%, the contrast at the time of the inspection will be good. Specifically, the contrast between the reflected light of the wavelength of the inspection light at the surface of the reflective layer 12 or at the surface of the protective layer 13 and the reflected light of the wavelength of the inspection light at the surface of the low reflection layer 15, will be at least 30%.

In this specification, the contrast can be obtained by using the following formula.

$$\text{Contrast (\%)}=((R_2-R_1)/(R_2+R_1))\times 100$$

Figure 2:
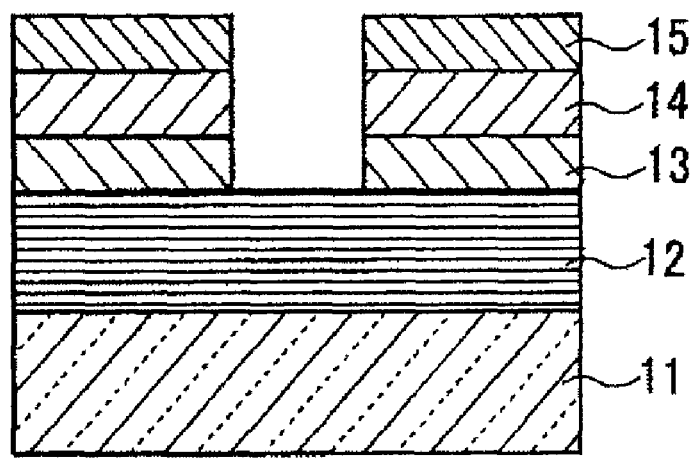
FIG. 2 illustrates a state wherein a pattern is formed on the absorber layer 14 (and the low reflection layer 15) of the EUV mask blank 1 shown in FIG. 1.

Here, $R_2$ at the wavelength of the inspection light is the reflectance at the surface of the reflective layer 12 or at the surface of the protective layer 13, and $R_1$ is the reflectance at the surface of the low reflection layer 15. Further, the above $R_1$ and $R_2$ are measured in a state where a pattern is formed on the absorber layer 14 (and the low reflection layer 15) of the EUV mask blank 1 shown in FIG. 1, as shown in FIG. 2. The above $R_2$ is a value measured at the surface of the reflective layer 12 or at the surface of the protective layer 13 exposed by the removal of the absorber layer 14 and the low reflection layer 15 by formation of a pattern in FIG. 2, and $R_1$ is a value measured at the surface of the low reflection layer 15 remained without being removed by the formation of a pattern.

In a case where the EUV mask blank of the present invention has a low reflection layer, the contrast represented by the above formula, is more preferably at least 45%, further preferably at least 60%, particularly preferably at least 80%.

In order to accomplish the above-described properties, the low reflection layer 15 is preferably constituted by a material having a lower refractive index at a wavelength of the inspection light than the absorber layer 14, and its crystal state is preferably amorphous.

With the low reflection layer 15 in the EUV mask blank 1 of the present invention, the above-described properties are satisfied by containing Ta and O in the following specific ratio.

The low reflection layer 15 preferably has a Ta content of from 10 to 80 at % and an O content of from 20 to 90 at %. If the O content exceeds 90 at %, the electrical conductivity of the low reflection layer 15 tends to be low, and a problem of charge up at the time of drawing an electron beam on the low reflection layer 15 is likely to result. If the O content is less than 20 at %, it becomes difficult to sufficiently lower the light reflectance of the pattern-inspection light.

The Ta content is preferably from 10 to 75 at %, more preferably from 15 to 75 at %, further preferably from 35 to 75 at %, particularly preferably from 40 to 70 at %. The O content is preferably from 25 to 90 at %, more preferably from 25 to 85 at %, further preferably from 25 to 65 at %, particularly preferably from 30 to 60 at %.

Further, the low reflection layer 15 may contain an element other than Ta and O, as the case requires. In such a case, the element to be incorporated in the low reflection layer 15 is required to satisfy the suitability as a mask blank, such as the property to absorb the EUV light.

As an example of the element to be incorporated to the low reflection layer 15, nitrogen (N) may be mentioned. It is considered that when the low reflection layer 15 contains N, the smoothness of the surface of the low reflection layer 15 will be improved.

In a case where the low reflection layer 15 contains N, it is preferred that the Ta content in the low reflection layer 15 is from 10 to 80 at %, the total content of O and N is from 20 to 90 at %, and the compositional ratio of O to N is from 19:1 to 1:19. In a case where the total content of O and N is lower than 20 at %, it may not be possible to sufficiently lower the light reflectance in a wavelength region of the pattern inspection light. In a case where the total content of O and N is higher than 90 at %, it is possible that the insulation property of the lower reflection layer 15 increases, and charge up takes place at the time of drawing an electron beam on the low reflection layer 15.

The Ta content is preferably from 10 to 75 at %, more preferably from 15 to 75 at %, further preferably from 35 to 75 at %, particularly preferably from 40 to 70 at %. The total content of O and N is preferably from 25 to 90 at %, more preferably from 25 to 80 at %, further preferably from 25 to 65 at %, particularly preferably from 30 to 60 at %. Further, the compositional ratio of O to N is preferably from 19:1 to 1:19, more preferably from 18:1 to 1:18, further preferably from 8:2 to 2:8, particularly preferably from 7:3 to 3:7.

The absorber layer contains a certain amount of hydrogen, but the low reflection layer preferably does not contain hydrogen. The hydrogen content in the low reflection layer is preferably at most 5 at %, more preferably at most 3 at %, further preferably at most 1 at %. Further, the hydrogen content in the absorber layer is preferably larger by at least 1 at %, more preferably at least 3 at %, further preferably at least 5 at %, than the hydrogen content in the low reflection layer.

The low reflection layer 15 has the above construction, whereby the crystal state is amorphous, and its surface is excellent in smoothness. Specifically, the surface roughness (rms) of the surface of the low reflection layer 15 is at most 0.5 nm.

As mentioned above, in order to prevent deterioration in the dimension precision of a pattern due to an influence of the edge roughness, the surface of the absorber layer 14 is required to be smooth. The low reflection layer 15 is formed on the absorber layer 14, and for the same reason, its surface is required to be smooth.

When the surface roughness (rms) of the surface of the low reflection layer 15 is at most 0.5 nm, the surface of the low reflection layer 15 is sufficiently smooth, and there is no worry about deterioration of the dimensional precision of a pattern due to an influence of edge roughness. The surface roughness (rms) of the surface of the low reflection layer 15 is more preferably at most 0.4 nm, further preferably at most 0.3 nm.

Further, from the viewpoint of reduction of the surface roughness, it is preferred to incorporate N to the low reflection layer 15.

Further, it is possible to confirm by an X-ray diffraction (XRD) method that the crystalline state of the low reflection layer 15 is amorphous, i.e. an amorphous structure or a fine crystal structure. When the crystal state of the low reflection layer 15 is an amorphous structure or a fine crystal structure, no sharp peak will be observed among the diffraction peaks obtainable by the XRD measurement.

In a case where the low reflection layer 15 is to be formed on the absorber layer 14, the total thickness of the absorber layer 14 and the low reflection layer 15 is preferably from 55 to 130 nm. Further, if the thickness of the low reflection layer 15 is thicker than the thickness of the absorber layer 14, the EUV light absorption property of the absorber layer 14 is likely to be low, and accordingly, the thickness of the low reflection layer 15 is preferably less than the thickness of the absorber layer. Accordingly, the thickness of the low reflection layer 15 is preferably from 5 to 30 nm, more preferably from 10 to 20 nm.

In a case where the low reflection layer 15 having the above-described construction contains no N, i.e. contains Ta and O, the low reflection layer 15 containing Ta and O is formed by letting a Ta target discharge in an atmosphere of oxygen ($O_2$) diluted with an inert gas containing at least one member selected from the group consisting of helium (He), argon (Ar), neon (Ne), krypton (Kr) and xenon (Xe).

On the other hand, in a case where the low reflection layer 15 contains N, a low reflection layer 15 containing Ta, N and O can be formed by carrying out a sputtering method using a Ta target, such as a magnetron sputtering method or an ion beam sputtering method, in an atmosphere of oxygen ($O_2$) and nitrogen ($N_2$) diluted with an inert gas containing at least one member selected from the group consisting of helium (He), argon (Ar), neon (Ne), krypton (Kr) and xenon (Xe). Otherwise, a low reflection layer 15 containing Ta, N and O may be obtained by forming a film containing Ta and N by discharging a Ta target in an atmosphere of nitrogen ($N_2$) diluted with an inert gas containing at least one member selected from the group consisting of helium (He), argon (Ar), neon (Ne), krypton (Kr) and xenon (Xe), followed by exposure to an oxygen plasma or irradiation with an ion beam employing oxygen, to oxidize the formed film.

In order to form the low reflection layer 15 by the above-described method, specifically, the method may be carried out under the following film-forming conditions.

Case where Reflection Layer (Containing No N) is Formed

Sputtering gas: A mixed gas of Ar and $O_2$ ($O_2$ gas concentration: from 3 to 80 vol %, preferably from 5 to 60 vol %, more preferably from 10 to 40 vol %; gas pressure: from $1.0\times10^{-1}$ Pa to $50\times10^{-1}$ Pa, preferably from $1.0\times10^{-1}$ Pa to $40\times10^{-1}$ Pa, more preferably from $1.0\times10^{-1}$ Pa to $30\times10^{-1}$ Pa).

Applied electric power: From 30 to 1,000 W, preferably from 50 to 750 W, more preferably from 80 to 500 W.

Film-forming rate: From 0.01 to 60 nm/min, preferably from 0.05 to 45 nm/min, more preferably from 0.1 to 30 nm/min.

Case where No Reflection Layer (Containing N) is Formed

Sputtering gas: A mixed gas of Ar, $O_2$ and $N_2$ ($O_2$ gas concentration: from 5 to 80 vol %, $N_2$ gas concentration: from 5 to 75 vol %, preferably $O_2$ gas concentration: from 6 to 70 vol %, $N_2$ gas concentration: from 6 to 35 vol %, more preferably $O_2$ gas concentration: from 10 to 30 vol %, $N_2$ gas concentration: from 10 to 30 vol %; Ar gas concentration: from 5 to 90 vol %, preferably from 10 to 88 vol %, more preferably from 20 to 80 vol %; gas pressure: from $1.0\times10^{-1}$ Pa to $50\times10^{-1}$ Pa, preferably from $1.0\times10^{-1}$ Pa to $40\times10^{-1}$ Pa, more preferably from $1.0\times10^{-1}$ Pa to $30\times10^{-1}$ Pa).

Applied electric power: From 30 to 1,000 W, preferably from 50 to 750 W, more preferably from 80 to 500 W.

Film-forming rate: From 0.01 to 60 nm/min, preferably from 0.05 to 45 nm/min, more preferably from 0.1 to 30 nm/min.

Further, in a case where an inert gas other than argon is to be used, the concentration of such an inert gas is made to be within the same concentration range as the above-mentioned Ar gas concentration. Further, in a case where a plurality of inert gases are to be used, the total concentration of such inert gases is made to be within the same concentration range as the above-mentioned Ar gas concentration.

Here, the reason why it is preferred to form the low reflection layer 15 on the absorber layer 14 in the EUV mask blank 1 of the present invention, is that the wavelength of the inspection light for a pattern is different from the wavelength of the EUV light. Accordingly, in a case where EUV light (in the vicinity of 13.5 nm) is used as the inspection light for a pattern, it is considered unnecessary to form a low reflection layer 15 on the absorber layer 14. The wavelength of the inspection light tends to shift to a lower wavelength side as the pattern dimension becomes small, and it is considered that in future, it will shift to 193 nm or further to 13.5 nm. In a case where the wavelength of the inspection light is 13.5 nm, it is considered unnecessary to form a low reflection layer 15 on the absorber layer 14.

The conductive film is not particularly limited so long as it has the desired properties as a conductive film for the EUV mask blank. Here, the properties particularly required for the conductive film are such that the sheet resistance is low and the surface roughness is small. Specifically, the sheet resistance is preferably at most 100Ω/□, more preferably at most 50Ω/□. If the surface roughness (rms) of the conductive film surface is large, when a friction occurs between the conductive film and an electrostatic chuck, peeling or chipping of the conductive film is likely to take place, which will cause formation of particles. When the surface roughness (rms) of the conductive film surface is at most 0.5 nm, the conductive film surface is sufficiently smooth, whereby peeling or chipping of the film scarcely takes place. The surface roughness (rms) of the conductive film surface is more preferably at most 0.4 nm, further preferably at most 0.3 nm.

In view of a low sheet resistance, the conductive film is preferably made of a material comprising at least one element selected from the group consisting of chromium (Cr), tantalum (Ta), titanium (Ti), molybdenum (Mo), aluminum (Al) and silicon (Si), or preferably comprises such a material and at least one element selected from the group consisting of nitrogen (N), oxygen (O), boron (B) and hydrogen (H). Especially, Cr, CrN, CrB, CrBN, Ta or TaN may, for example, be preferred since such a material is inexpensive or good in adhesion to the substrate. The thickness of the conductive film is preferably from 30 to 200 nm. Further, the conductive film may not have a uniform composition and may, for example, have a construction wherein the composition has a gradient, or a double-layered construction.

The conductive film is formed by using a well-known film-forming method such as a magnetron sputtering method or an ion beam sputtering method. In a case where a CrN film is formed by a magnetron sputtering method, it is preferred to carry out the film forming by using a Cr target as the target and a mixed gas (gas pressure: $1.0 \times 10^{-2}$ Pa to $10 \times 10^{-1}$ Pa) of Ar and N as the sputtering gas with an applied power of from 50 W to 2,000 W at a film-forming rate of 0.02 to 1.0 nm/sec so that the thickness will be from 50 to 100 nm.

EXAMPLES

Now, the present invention will be described in further detail with reference to Examples.

Example 1

In this Example, an EUV mask blank as shown in FIG. 1 was prepared. However, in the EUV mask blank 1 in Example 1, no low reflection layer 15 was formed on an absorber layer 14. As a substrate 11 for film forming, a $SiO_2$—$TiO_2$ type glass substrate (shape: 6 inch (152 mm) square, thickness: 6.3 mm) was used. This glass substrate had a thermal expansion coefficient of $0.2 \times 10^{-7}$/° C., a Young's modulus of 67 GPa, a Poisson's ratio of 0.17 and a specific rigidity of $3.07 \times 10^7$ $m^2/s^2$. This glass substrate was polished to form a smooth surface having a surface roughness (rms) of at most 0.15 nm with a flatness of at most 100 nm.

On the rear side of the substrate 11, a conductive film having a sheet resistance of 70Ω/□ was applied by forming a CrN film having a thickness of 100 nm by using a magnetron sputtering method.

On a flat-plate-form usual electrostatic chuck, a substrate 11 (shape: 6 inch (152 mm) square, thickness: 6.3 mm) was fixed via the formed CrN film, and on the surface of the substrate 11, a Si film and a Mo film were alternately formed by an ion beam sputtering method for 40 cycles to form a Si/Mo multilayered reflective film (reflective layer 12) having a total film thickness of 272 nm ((4.5 nm+2.3 nm)×40).

Further, on the Si/Mo multilayered reflective film (reflective layer 12), a Ru film (film thickness: 2.5 nm) was formed by an ion beam sputtering method to form a protective layer 13.

The film forming conditions for the CrN film, the Si film, the Mo film and the Ru film were as follows.

Film-Forming Conditions for CrN Film
  Target: Cr target
  Sputtering gas: Mixed gas of Ar and $N_2$ (Ar: 70 vol %, $N_2$: 30 vol %, gas pressure: 0.3 Pa)
  Applied power: 150 W
  Film-forming rate: 0.11 nm/sec
  Film thickness: 100 nm Film-Forming Conditions for Si Film
  Target: Si target (boron-doped)
  Sputtering gas: Ar gas (gas pressure: 0.02 Pa)
  Voltage: 700 V
  Film-forming rate: 0.077 nm/sec
  Film thickness: 4.5 nm Film-Forming Conditions for Mo Film
  Target: Mo target
  Sputtering gas: Ar gas (gas pressure: 0.02 Pa)
  Voltage: 700 V
  Film-forming rate: 0.064 nm/sec
  Film thickness: 2.3 nm Film-Forming Conditions for Ru Film
  Target: Ru target
  Sputtering gas: Ar gas (gas pressure: 0.02 Pa)
  Voltage: 500 V
  Film-forming rate: 0.023 nm/sec
  Film thickness: 2.5 nm Then, on the protective layer 13, an absorber layer 14 (TaNH film) containing Ta, N and H was formed by using a magnetron sputtering method to obtain an EUV mask blank 1 having the reflective layer 12, the protective layer 13 and the absorber layer 14 formed in this order on the substrate 11.

The film-forming conditions for the absorber layer 14 were as follows.

Film-Forming Conditions for Absorber Layer 14 (TaNH Film)
  Target: Ta target
  Sputtering gas: Mixed gas of Ar, $N_2$ and $H_2$ (Ar: 89 vol %, $N_2$: 8.3 vol %, $H_2$: 2.7 vol %, gas pressure: 0.46 Pa)
  Applied power: 300 W
  Film-forming rate: 1.5 nm/min
  Film thickness: 60 nm With respect to the absorber layer (TaNH film) of the EUV mask blank obtained by the above procedure, the following evaluations (1) to (4) were carried out.

(1) Film Composition

The composition of the absorber layer 14 (TaNH film) is measured by using an X-ray photoelectron spectrometer) (manufactured by PERKIN ELEMER-PHI), a secondary ion mass spectrometer (manufactured by PHI-ATOMIKA) and a Rutherford back scattering spectroscopy (manufactured by KOBE STEEL, LTD.). The compositional ratio (at %) of the absorber layer 14 (TaNH film) is Ta:N:H=58.1:38.5:3.4 (Ta content: 58.1 at %, N content: 38.5 at % and H content: 3.4 at %).

(2) Crystalline State

The crystalline state of the absorber layer (TaNH film) was confirmed by the X-ray Diffractometer (manufactured by Rigaku Corporation). Among the obtained diffraction peaks, no sharp peak was observed, and thus it was confirmed that the crystalline state of the absorber layer was an amorphous structure or fine crystal structure.

(3) Film Stress

The film stress of the absorber 14 (TaNH film) was measured by using FLX-2320, (manufactured by KLA-Tencor) and was found to be −56 MPa. Further, the film stress of the TaNH film in this Example was very small as compared with the TaN film in Comparative Example 1 given hereinafter, and accordingly, it is expected that warpage of the mask is small and the dimensional precision at the time of exposure for a pattern is high.

(4) Surface Roughness

The surface roughness of the absorber layer 14 (TaNH film) was measured by the dynamic force mode by using an Atomic Force Microscope (SPI-3800, manufactured by SII).

The region for measurement of the surface roughness was 1 µm×1 µm, and SI-DF40 (manufactured by SII) was used as the cantilever.

The surface roughness (rms) of the absorber layer was 0.25 nm. Further, the TaNH film in this Example has the surface roughness which is small as compared with the TaN film in Comparative Example 2 given hereinafter, and accordingly, it is expected that the line edge roughness at the time of forming a pattern will be small.

Further, the etching property (5) of the absorber layer (TaNH film) of the EUV mask blank obtained by the above procedure was evaluated by the following procedure.

(5) Etching Property

The etching property was evaluated by the following method instead of evaluation by using the EUV mask blank prepared by the above procedure.

On a sample table (4 inch quartz substrate) of an RF plasma etching apparatus, a Si chip (10 mm×30 mm) having a Ru film or a TaNH film formed by the following method, was set as a sample. In this state, the Ru film or the TaNH film of the Si chip set on the sample table was subjected to plasma RF etching under the following conditions.

Bias RF: 50 W
Etching time: 120 sec
Trigger pressure: 3 Pa
Etching pressure: 1 Pa
Etching gas: $Cl_2$/Ar
Gas flow rate ($Cl_2$/Ar):20/80 sccm
Distance between electrode and substrate: 55 mm The TaNH film was formed by the same method as in Example 1. Further, the film formation of the Ru film was carried out by a magnetron sputtering method under the following film-forming conditions.

Film-Forming Conditions for Ru Film
Target: Ru target
Sputtering gas: Ar gas (gas pressure: 0.3 Pa)
Voltage: 350 V
Film-forming rate: 0.25 nm/sec
Film thickness: 2.5 nm With respect to the Ru film and the TaNH film formed under the above conditions, the etching rates were obtained, and the etching selectivity was obtained by using the following formula.

Etching selectivity=Etching rate of TaNH film/Etching rate of Ru film

The etching rates of the Ru film and the TaNH film are as follows.

Etching rate of Ru film: 1.48 (nm/min)
Etching rate of TaNH film: 15.9 (nm/min)

The etching selectivity calculated as above is 10.7. The etching selectivity to the protective layer 13 is preferably at least 10, and the TaNH film had a sufficient etching selectivity.

Example 2

In this Example, an EUV mask blank 1 having a low reflection layer 15 (TaON film) containing Ta, N and O formed on an absorber layer 14 (TaNH film) was prepared.

In this Example, the procedure up to forming an absorber layer 14 on the protective layer 13 was carried out in the same manner as in Example 1. On the absorber layer 14, a low reflection layer containing Ta, N and O was formed as a low reflection layer 15 to an inspection light with an wavelength of 257 nm, by using a magnetron sputtering method. The compositional ratio (at %) of the low reflection layer was Ta:N:O=22.1:4.4:73.5, as measured by the same method as in Example 1.

The film-forming conditions for the low reflection layer 15 (TaON film) were as follows.

Film-Forming Conditions for Low Reflection Layer 15 (TaON Film)
Target: Ta target
Sputtering gas: Mixed gas of Ar, $N_2$ and $O_2$ (Ar: 36 vol %, $N_2$: 14 vol %, $O_2$: 50 vol %, gas pressure: 0.3 Pa)
Applied power: 450 W
Film-forming rate: 0.28 nm/min
Film thickness: 10 nm With respect to the low reflection layer 15 (TaON film) of the EUV mask blank obtained by the above procedure, the following reflectance evaluation (6) was carried out.

(6) Reflection Property (Evaluation of Contrast)

In Example 1, at the stage of forming up to the protective layer 13 (Ru film), the reflectance of the pattern inspection light (wavelength: 257 nm) at the surface of the protective layer 13 was measured by a spectrophotometer. Further, after forming the low reflection layer 15 in Example 2, the reflectance of the pattern inspection light at the surface of the low reflection layer was measured. As a result, the reflectance at the surface of the protective layer 13 was 60.0%, and the reflectance at the surface of the low reflection layer 15 was 9.1%. By using such results and the above-mentioned formula, the contrast was obtained and found to be 73.6%.

With respect to the EUV mask blank 1 thus obtained, the surface of the low reflection layer 15 was irradiated with EUV light (wavelength: 13.5 nm), whereby the reflectance of the EUV light was measured. As a result, the reflectance of the EUV light was 0.6%, and it was confirmed that the mask blank was excellent in the EUV absorption property.

Example 3

Example 3 was carried out in the same manner as in Example 1 except that the absorber layer 14 (TaNH) was formed under the following conditions.

The film-forming conditions for the absorber layer 14 were as follows.

Film-Forming Conditions for Absorber Layer 14 (TaNH Film)
Target: Ta target
Sputtering gas: Mixed gas of Ar, $N_2$ and $H_2$ (Ar: 78.0 vol %, $N_2$: 11.1 vol %, 10.9 vol %, gas pressure: 0.36 Pa)
Applied power: 300 W
Film-forming rate: 1.3 nm/min
Film thickness: 60 nm The composition of the absorber layer 14 (TaNH) was measured in the same manner as in Example 1, whereby the compositional ratio (at %) of the absorber layer 14 (TaNH) was found to be Ta:N:H=53.4:36.6:10.0 (Ta content: 53.4 at %, N content: 36.6 at %, H content: 10.0 at %). The crystalline state of the obtained absorber layer 14 is confirmed by using an X-ray diffraction apparatus, whereby no sharp peak is observed among the obtained diffraction peaks, and it is confirmed that the crystalline state of the absorber layer is an amorphous structure or a fine crystal structure.

Further, the film stress of the absorber layer 14 (TaNH) was measured in the same manner as in Example 1 and was found to be −56 MPa.

Further, the surface roughness of the absorber layer 14 (TaNH) was measured in the same manner as in Example 1 and found to be 0.34 nm. Further, the surface roughness of the TaNH film in this Example is small as compared with the TaN film in Comparative Example 2 given hereinafter, whereby it is expected that the line edge roughness at the time of forming a pattern will be small.

Further, the etching property of the absorber layer (TaNH film) of the EUV mask blank obtained by the above procedure was examined and evaluated by the same procedure as in Example 2, whereby the etching rate of the TaNH film was 16.2 (nm/min), and the selectivity to the Ru protective layer was 10.9. The etching selectivity to the protective layer 13 is preferably at least 10, and the TaNH film was found to have a sufficient etching selectivity.

Example 4

In Example 4, on TaNH having the absorber layer 14 prepared by the same procedure as in Example 3, a low reflection layer 15 (TaON) was formed in the same manner as in Example 2 to prepare an EUV mask blank 1.

The reflectance of the pattern inspection light (wavelength: 257 nm) of the obtained EUV mask blank 1 was measured in the same manner as in Example 2, whereby the reflectance at the surface of the low reflection layer 15 was 8.5%, and the contrast to the surface of the protective layer 13 was 75.1%. With respect to the obtained EUV mask blank 1, the reflectance of the EUV light was measured in the same manner as in Example 1, whereby the reflectance of the EUV light was 0.6%, and thus it was confirmed that the mask blank was excellent in the EUV absorption property.

Example 5

Example 5 was carried out in the same manner as in Example 1 except that the absorber layer 14 (TaNH) was formed under the following conditions.

The film-forming conditions of the absorber layer 14 were as follows.
Film-Forming Conditions for Absorber Layer 14 (TaNH Film)
  Target: Ta target
  Sputtering gas: Mixed gas of Ar, $N_2$ and $H_2$ (Ar: 89.9 vol %, $N_2$: 8.1 vol %, $H_2$: 2 vol %, gas pressure: 0.32 Pa)
  Applied power: 300 W
  Film-forming rate: 1.3 nm/min
  Film thickness: 60 nm The composition of the absorber layer 14 (TaNH) was measured in the same manner as in Example 1, whereby the compositional ratio (at %) of the absorber layer 14 (TaNH) was found to be Ta:N:H=63.9:35.8:0.3 (Ta content: 63.9 at %, N content: 35.8 at %, H content: 0.3 at %). The crystalline state of the obtained absorber layer 14 is confirmed by using an X-ray diffraction apparatus, whereby no sharp peak is obtained among the obtained diffraction peaks, and it is confirmed that the crystalline state of the absorber layer is an amorphous structure or a fine crystal structure.

Further, the film stress of the absorber layer 14 (TaNH film) was measured in the same manner as in Example 1 and found to be −56 MPa.

Further, the surface roughness of the absorber layer 14 (TaNH) was measured in the same manner as in Example 1 and found to be 0.34 nm. Further, the surface roughness of the TaNH film in this Example is small as compared with the TaN film in Comparative Example 2 given hereinafter, whereby it is expected that the line edge roughness at the time of forming a pattern will be small.

Further, the etching property of the absorber layer (TaNH film) of the EUV mask blank obtained by the above procedure was examined and evaluated in the same manner as in Example 1, whereby the etching rate of the TaNH film was 16.2 nm/min, and the selectivity to the Ru protective layer was 10.7. The etching ratio to the protective layer 13 is preferably at least 10, and thus, the TaNH film was found to have a sufficient etching selectivity.

Example 6

In Example 6, on TaNH having the absorber layer 14 prepared in the same manner as in Example 5, a low reflection layer 15 (TaON) is formed in the same manner as in Example 2 to obtain an EUV mask blank 1.

The reflectance of the pattern inspection light (wavelength: 257 nm) of the obtainable EUV mask blank 1 is measured in the same manner as in Example 2, whereby the reflectance at the surface of the low reflection layer 15 is 8.5%, and the contrast to the surface of the protective layer 13 is 75.1%. With respect to the obtained EUV mask blank 1, the reflectance of the EUV light is measured in the same manner as in Example 1, whereby the reflectance of the EUV light is 0.6%, and it is thereby confirmed that the mask blank is excellent in the EUV absorption property.

Comparative Example 1

Comparative Example 1 was carried out in the same manner as in Example 1 except that the absorber layer 14 was a film of tantalum nitride (TaN). The TaN film was formed under the following conditions.
Film-Forming Conditions for TaN Layer
  Target: Ta target
  Sputtering gas: Mixed gas of Ar and $N_2$ (Ar: 86 vol %, $N_2$: 14 vol %, gas pressure: 0.37 Pa)
  Applied power: 300 W
  Film-forming rate: 1.1 nm/min
  Film thickness: 60 nm The composition of the absorber layer 14 (TaN) was measured in the same manner as in Example 1 and found to be Ta:N=55:45 (Ta content: 55 at %, N content: 45 at %, H content: 0 at %).

The crystalline state of the obtainable absorber layer 14 is confirmed by using an X-ray diffraction apparatus, whereby a sharp peak is observed among the obtainable diffraction peaks, and it is confirmed that the absorber layer is crystalline.

Further, the film stress of the absorber layer 14 (TaN) was measured in the same manner as in Example 1 and was found to be −3456 MPa.

Further, the surface roughness of the absorber layer 14 (TaN) was measured in the same manner as in Example 1 and was found to be 0.35 nm.

The absorber layer 14 (TaN film) in this Comparative Example 1 has a small surface roughness but a large film stress, whereby the dimensional precision at the time of exposure is expected to be poor, such being undesirable.

Comparative Example 2

Comparative Example 2 was carried out in the same manner as in Comparative Example 1 except that the film-forming conditions for the absorber layer 14 were changed. The TaN film was formed under the following conditions.
Film-Forming Conditions for TaN Layer
  Target: Ta target
  Sputtering gas: Mixed gas of Ar and $N_2$ (Ar: 91.7 vol %, $N_2$: 8.3 vol %, gas pressure: 0.46 Pa)
  Applied power: 300 W
  Film-forming rate: 1.4 nm/min
  Film thickness: 60 nm The composition of the absorber layer 14 (TaN film) was measured in the same manner as in Example 1, whereby Ta:N=65:35 (Ta content: 65 at %, N content: 35 at %, H content: 0%).

The crystalline state of the obtainable absorber layer (TaN film) is confirmed by using an X-ray diffraction apparatus, whereby a sharp peak is observed among the obtainable diffraction peaks, and it is confirmed that the absorber layer (TaN film) is crystalline.

Further, the film stress of the absorber layer 14 (TaN film) was measured in the same manner as in Example 1 and found to be −97 MPa.

Further, the surface roughness of the absorber layer 14 (TaN film) was measured in the same manner as in Example 1 and found to be 1.38 nm.

The absorber layer 14 (TaN film) in this Comparative Example 2 has a small film stress but a large surface roughness, and thus it is expected that the line edge roughness at the time of forming a pattern will be large, such being undesirable.

INDUSTRIAL APPLICABILITY

An EUV mask blank excellent in dimensional precision of a pattern, provided by the present invention, can be widely used in e.g. semiconductor industry.

The entire disclosure of Japanese Patent Application No. 2008-069215 filed on Mar. 18, 2008 including specification, claims, drawings and summary is incorporated herein by reference in its entirety.

What is claimed is:

1. A reflective mask blank for EUV lithography, comprising:
    a substrate;
    a reflective layer for reflecting EUV light over the substrate; and
    an absorber layer for absorbing EUV light formed in this order over the substrate;
    wherein the absorber layer contains tantalum (Ta), nitrogen (N) and hydrogen (H); and
    the total content of Ta and N is from 50 to 99.9 at %, and the content of H is from 0.1 to 50 at % in the absorber layer.

2. The reflective mask blank for EUV lithography according to claim 1, wherein in the absorber layer, the total content of Ta and N is from 50 to 98 at %, and the content of H is from 2 to 50 at %.

3. The reflective mask blank for EUV lithography according to claim 1, wherein in the absorber layer, the compositional ratio of Ta to N is Ta:N=9:1 to 3:7.

4. The reflective mask blank for EUV lithography according to claim 1, wherein the absorber layer has a total content of B, Si and Ge of at most 5 at %.

5. The reflective mask blank for EUV lithography according to claim 1, wherein the crystalline state of the absorber layer is amorphous.

6. The reflective mask blank for EUV lithography according to claim 1, wherein the absorber layer surface has a surface roughness (rms) of at most 0.5 nm.

7. The reflective mask blank for EUV lithography according to claim 1, wherein the absorber layer has a thickness of from 50 to 200 nm.

8. The reflective mask blank for EUV lithography according to claim 1, wherein the absorber layer has a total content of O and C of at most 5 at %.

9. The reflective mask blank for EUV lithography according to claim 1, wherein the absorber layer has a film stress of at most 300 MPa.

10. The reflective mask blank for EUV lithography according to claim 1, wherein a low reflection layer to an inspection light to be used for inspection of a mask pattern, is formed on the absorber layer and wherein the low reflection layer contains tantalum (Ta) and oxygen (O); and in the low reflection layer, the content of Ta is from 10 to 80 at %, and the content of O is from 20 to 90 at %.

11. The reflective mask blank for EUV lithography according to claim 10, wherein in the low reflection layer, the content of Ta is from 30 to 80 at %, and the content of O is from 20 to 70 at %.

12. The reflective mask blank for EUV lithography according to claim 1, wherein a low reflection layer to an inspection light to be used for inspection of a mask pattern, is formed on the absorber layer and wherein the low reflection layer contains tantalum (Ta), oxygen (O) and nitrogen (N); and in the low reflection layer, the content of Ta is from 10 to 80 at %, the total content of O and N is from 20 to 90 at %, and the compositional ratio of O to N is from 19:1 to 1:19.

13. The reflective mask blank for EUV lithography according to claim 12, wherein in the low reflection layer, the content of Ta is from 30 to 80 at %, the total content of O and N is from 20 to 70 at %, and the compositional ratio of O to N is from 9:1 to 1:9.

14. The reflective mask blank for EUV lithography according to claim 10, wherein the low reflection layer surface has a surface roughness (rms) of at most 0.5 nm.

15. The reflective mask blank for EUV lithography according to claim 10, wherein the low reflection layer has a thickness of from 5 to 30 nm.

16. The reflective mask blank for EUV lithography according to claim 1, wherein a low reflection layer to an inspection light to be used for inspection of a mask pattern, is formed on the absorber layer, and the hydrogen content in the absorber layer is higher by at least 1 at % than the hydrogen content in the low reflection layer.

17. The reflective mask blank for EUV lithography according to claim 1, wherein a low reflection layer to an inspection light to be used for inspection of a mask pattern, is formed on the absorber layer, and the hydrogen content in the low reflection layer is at most 5 at %.

18. The reflective mask blank for EUV lithography according to claim 10, wherein a protective layer for protecting the reflective layer at the time of forming a pattern on the absorber layer, is formed between the reflective layer and the absorber layer, and wherein the contrast between the reflected light at the protective layer surface and the reflected light at the low reflection layer surface, to the wavelength of light to be used for inspection of a pattern formed on the absorber layer, is at least 30%.

19. The reflective mask blank for EUV lithography according to claim 1, wherein a protective layer for protecting the reflective layer at the time of forming a pattern on the absorber layer, is formed between the reflective layer and the absorber layer, and the hydrogen content in the absorber layer is higher by at least 1 at % than the hydrogen content in the protective layer.

20. The reflective mask blank for EUV lithography according to claim 1, wherein a protective layer for protecting the reflective layer at the time of forming a pattern on the absorber layer, is formed between the reflective layer and the absorber layer, and the hydrogen content in the absorber layer is at most 5 at %.

21. The reflective mask blank for EUV lithography according to claim 18, wherein the protective layer is formed of any one member selected from the group consisting of Ru, a Ru compound, $SiO_2$ and CrN.

22. The reflective mask blank for EUV lithography according to claim 10, wherein the reflectance at the low reflection layer surface to the wavelength of light to be used for inspection of a pattern formed on the absorber layer, is at most 15%.

23. The reflective mask blank for EUV lithography according to claim 1, wherein the absorber layer is formed by carrying out a sputtering method employing a Ta target in an atmosphere comprising an inert gas containing at least one member selected from the group consisting of helium (He), argon (Ar), neon (Ne), krypton (Kr) and xenon (Xe), nitrogen ($N_2$) and hydrogen ($H_2$).

24. A method for producing a reflective mask blank for EUV lithography, comprising:

forming a reflective layer for reflecting EUV light, over a substrate; and then, forming an absorber layer over the reflective layer, wherein the absorber layer is formed by carrying out a sputtering method employing a Ta target in an atmosphere comprising an inert gas containing at least one member selected from the group consisting of helium (He), argon (Ar), neon (Ne), krypton (Kr) and xenon (Xe), nitrogen ($N_2$) and hydrogen ($H_2$).

* * * * *